United States Patent
Mackintosh et al.

(10) Patent No.: US 6,562,132 B2
(45) Date of Patent: May 13, 2003

(54) EFG CRYSTAL GROWTH APPARATUS AND METHOD

(75) Inventors: Brian H. Mackintosh, Concord, MA (US); Marc Ouellette, Nashua, NH (US)

(73) Assignee: ASE Americas, Inc., Billerica, MA (US)

( * ) Notice: Subject to any disclaimer, the term of this patent is extended or adjusted under 35 U.S.C. 154(b) by 0 days.

(21) Appl. No.: 09/826,073

(22) Filed: Apr. 4, 2001

(65) Prior Publication Data

US 2002/0144649 A1 Oct. 10, 2002

(51) Int. Cl.⁷ .......................... C30B 15/34; C30B 35/00
(52) U.S. Cl. .................. 117/209; 117/210; 117/214; 117/217; 117/200; 117/16; 117/13
(58) Field of Search .................. 117/16, 13, 210, 117/209, 214, 217, 200

(56) References Cited

U.S. PATENT DOCUMENTS

| | | | | |
|---|---|---|---|---|
| 4,443,411 A | * | 4/1984 | Kalejs | 117/211 |
| 4,661,324 A | * | 4/1987 | Sink et al. | 117/210 |
| 4,726,831 A | * | 2/1988 | Fogle et al. | 65/128 |
| 4,997,628 A | * | 3/1991 | Piotrowski | 117/217 |
| 5,009,860 A | * | 4/1991 | Ikeda | 117/222 |
| 5,037,622 A | | 8/1991 | Harvey et al. | 422/249 |
| 5,098,229 A | | 3/1992 | Meier et al. | 406/93 |
| 5,106,763 A | | 4/1992 | Bathey et al. | 437/2 |
| 5,156,978 A | | 10/1992 | Bathey et al. | 31/18 |
| 5,558,712 A | | 9/1996 | Kalejs | 117/209 |
| 6,111,908 A | * | 8/2000 | Jones | 373/128 |
| 6,139,811 A | * | 10/2000 | Cao et al. | 117/16 |

FOREIGN PATENT DOCUMENTS

JP         61-214398        * 9/1986   ............ G21B/1/00

OTHER PUBLICATIONS

Patent Abstracts of Japan. Abstract of JP 61–214398. (1986).*

* cited by examiner

Primary Examiner—Robert Kunemund
Assistant Examiner—Matthew Song
(74) Attorney, Agent, or Firm—Pandiscio & Pandiscio

(57) ABSTRACT

An improved mechanical arrangement controls the introduction of silicon particles into an EFG (Edge-defined Film-fed Growth) crucible/die unit for melt replenishment during a crystal growth run. A feeder unit injects silicon particles upwardly through a center hub of the crucible/die unit and the mechanical arrangement intercepts the injected particles and directs them so that they drop into the melt in a selected region of the crucible and at velocity which reduces splashing, whereby to reduce the likelihood of interruption of the growth process due to formation of a solid mass of silicon on the center hub and adjoining components. The invention also comprises use of a Faraday ring to alter the ratio of the electrical currents flowing through primary and secondary induction heating coils that heat the crucible die unit and the mechanical arrangement.

29 Claims, 7 Drawing Sheets

EFG CRYSTAL GROWTH APPARATUS AND METHOD

This invention was made under DOE Subcontract No. ZAX-8-17647-10.

FIELD OF THE INVENTION

This invention relates to growing crystalline bodies from a melt by the Edge-defined Film-fed Growth ("EFG") process, and more particularly to improvements in apparatus for growing hollow crystalline bodies by the EFG process.

BACKGROUND OF THE INVENTION

The EFG process is well known, as evidenced by the following U.S. Pat. Nos. 4,230,674; 4,661,324; 4,647,437; 4,968,380; 5,037,622; 5,098,229; 5,106,763; 5,156,978; and 5,558,712. In the EFG process crystalline bodies having a predetermined cross-sectional shape are grown on a seed from a liquid film of a selected feed material which is transported by capillary action from a melt contained in a crucible through one or more capillaries in an EFG die to the top end surface of the die. The shape of the crystalline body is determined by the external or edge configuration of the top end surface of the die. A major use of the EFG process is to grow polygonally-shaped hollow bodies of silicon, e.g., "nonagons" or "octagons". These shaped hollow bodies are subdivided at their corners into a plurality of flat substrates that are used to form photovoltaic solar cells.

The preferred form of apparatus for growing hollow bodies by the EFG process comprises a capillary die/crucible assembly having a center hub which provides a passageway through which silicon particles are introduced to replenish the melt in the surrounding crucible during the growth process. In growing silicon bodies, the silicon particles are typically in the form of substantially spherical pellets having as size in the order of 2 mm. The particles are injected through he center hub into the space above the crucible, where they are deflected back down into the crucible. The common practice is to deliver the particles in predetermined quantities on an intermittent basis according to the rate of consumption of the melt, so as to maintain the level of the melt in the crucible within predetermined limits.

Growth of large thin-walled hollow bodies by EFG (e.g., silicon octagons in which each side or facet is 10 cm. wide) necessitates precise control of the heat input, since it is essential to maintain the temperature at the growth interface, i.e., in the meniscus region between the top end face of the die and the seed or the body grown on the seed, substantially constant at a level that allows growth to occur at a selected rate. In the EFG apparatus commonly used to grow hollow silicon bodies, heating is provided by induction heating coils that surround the furnace enclosure in which the crucible/die assembly is mounted. Thermal control of the growing crystalline body is achieved by controlling the heating power and also, inter alia, by use of concentric inner and outer after heaters between which the growing body is pulled away from the die. The afterheaters are, in effect, susceptors and are heated by electromagnetic induction. The inner and outer afterheaters help to control the thermal gradient lengthwise of the growing crystal and also affect the thermal gradient of the die and crucible in a radial direction, i.e., normal to the pulling axis.

Successful growth using the EFG process is complicated by the fact that variations in temperature tend to exist around the circumference of an EFG die and also radially of the die and crucible. Variations in thermal symmetry around the circumference of the die can cause local changes in thickness of the growing crystalline body. Such variations also make it difficult to sustain growth, often resulting in rupturing of the liquid menisci that extend between the die and the growing crystal body. When the menisci are ruptured, the growth stops.

Improvements in die design have reduced variations in thermal symmetry around the circumference of the die, thereby improving the quality of the grown bodies and reducing the rate of occurrence of rupturing of the menisci. However, even with improved die designs, EFG crystal growth apparatus of the type using crucibles with a center hub have been handicapped by a tendency for solid silicon to become attached to or grow on the center hub region of the crucible during crystal growth in response to disturbances in the growth zone. In this connection it should be noted that the thermal gradient in a radial direction is such that center hub of the crucible tends to be colder than the outer perimeter of the crucible.

It has been determined that prior EFG crystal growth apparatus lacks adequate means for controlling the path and speed of the particles as they travel out of the center hub and into the melt in the crucible, with the result that (a) sometimes the particles falling into the crucible cause splashing of the melt, with the result that liquid silicon impinges upon the upper portion of the center hub and (b) sometimes some of the solid particles come into direct contact with the upper end of the center hub. When this occurs, depending on the temperature of the center hub, the liquid silicon will solidify on and the silicon particles will become attached to and grow outward from the center hub, ultimately forming a mushroom-shaped solid mass that may be large enough to impede replenishment of the melt. Such solidification near the center hub region also affects the uniformity of the growing crystalline body and disrupts growth. Also fluctuations in temperature can result in pieces of the mushroom-shaped piece breaking off and failing into the melt, causing the crucible to overfill and flood the die.

Prior to this invention a common heater arrangement has comprised coaxial primary and secondary induction heating coils connected in series with a suitable, medium-frequency, power supply, with the primary coil having three turns and the secondary coil having a single turn and located above and spaced from the primary coil. The heater arrangement has also included a saturable reactor connected in parallel with the primary coil for the purpose of controlling the ratio of the currents flowing through the two coils. The saturable reactor allows the ratio of the currents to be adjusted, thereby modifying the temperature distribution along the axis of the furnace. However, saturable reactors suffer from the fact that they are costly, noisy and electrically inefficient.

OBJECTS AND SUMMARY OF THE INVENTION

A primary object of this invention is to provide an improved feed distributor/EFG crucible/die unit arrangement that controls the path of silicon particles as they move under gravity from a central feed tube to the crucible.

Another primary object is to provide an improved means for controlling the electromagnetic energy field used to heat an EFG crystal growth furnace.

A further object of this invention is to provide in an EFG crystal growth apparatus a particle feed distributor of novel design to control delivery of silicon particles into the melt-containing crucible so as to effectively eliminate or substantially reduce the occurrence of crystal growth on the center hub of the crucible.

Another object of the present invention is to provide in an EFG crystal growth apparatus for growing hollow bodies a combination particle distributor/inner afterheater assembly that substantially prevents or minimizes undesired solidification of melt material near the center region of the EFG die.

Still another object is to provide an improved method of delivering silicon particles into a crucible in an EFG crystal growth apparatus.

A further object is to provide an improved method of controlling the flow of electrical current in a pair of induction heating coils used to heat an EFG crystal growth apparatus.

Another object of the invention is to avoid solidification of silicon onto members associated with the EFG die, whereby to avoid premature termination of a growth run.

Still another object of the invention is to provide an improved method of growing a tubular crystalline body from a pool of melt.

The foregoing and other objects of this invention are achieved by modifying the particle distributor/inner afterheater structure associated with an EFG crucible/capillary die assembly, as typified by the apparatus disclosed in U.S. Pat. Nos. 4,661,324, 4,968,380, 5,037,622; and 5,098,229, so as provide particle distribution and flow control means that reduce the likelihood of silicon particles and splashed molten silicon contacting and adhering to relatively cold portions of the center hub section of the crucible and serving as the nucleus or site for further accretions caused by solidification of molten silicon from the melt, whereby to avoid interruption of the growth process and/or production of tubular bodies of poor quality. Control of the rate of heating is improved by using a Faraday ring to adjust the ratio of power supplied by the primary and secondary induction heating coils.

Other objects and features of the invention are set forth or described in the following detailed specification which is to be considered together with the accompanying drawings.

BRIEF DESCRIPTION OF THE DRAWINGS

For a fuller understanding of the nature and objects of the present invention, reference should be made to the following detailed description taken in connection with the accompanying drawings wherein.

In the several figures, identical numbers refer to identical elements.

DETAILED DESCRIPTION

Figure 1:
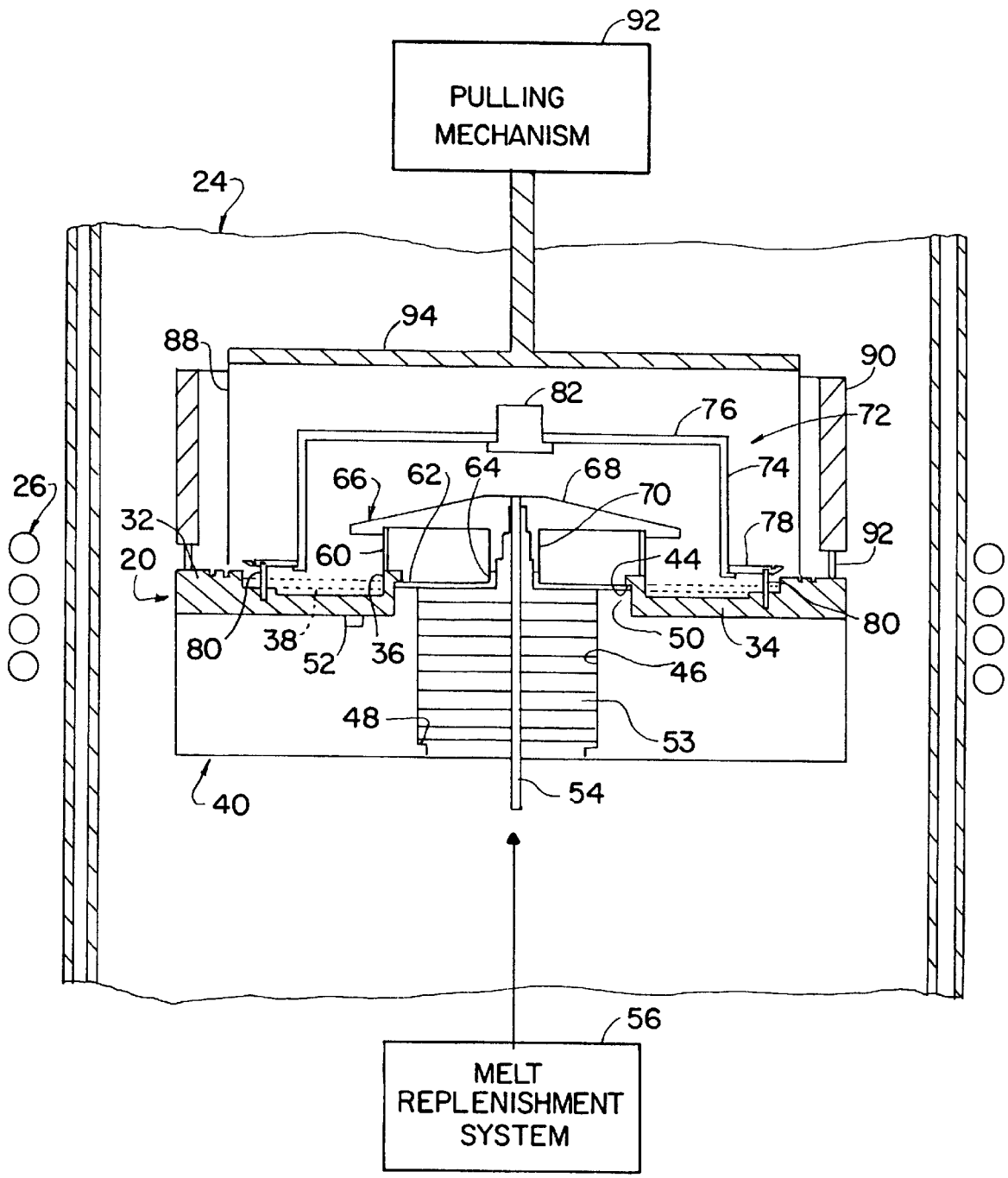
FIG. 1 is front elevation view, partly in axial cross-section, of an EFG crystal growth furnace apparatus that includes a silicon feed distributor assembly of the type used prior to the present invention.

FIG. 1 illustrates a preferred form of EFG crystal growth apparatus in use prior to the present invention for growing hollow silicon bodies. This prior art apparatus comprises a crucible/capillary die unit 20, made in accordance with the teachings of U.S. Pat. No. 5,037,622, installed in a furnace that comprises an enclosure 24 (only part of which is shown for simplicity of illustration), and a heating coil 26 surrounding enclosure 24. The crucible/die unit 20 is made of graphite and includes a short, open-topped crucible comprising an upstanding outer side wall 32, a bottom wall 34 and an annular inner side wall 36 which forms an annular hub. Outer side wall 32, bottom wall 34 and inner side wall 36 together define an annular space in which a melt 38 is contained. Although not visible in FIG. 1, the outer side wall 32 includes a capillary die portion that has substantially the same construction as the one illustrated in FIGS. 3–7 of said U.S. Pat. No. 5,037,622, and the teachings of that patent are incorporated herein by reference. The apparatus of FIG. 1 further includes a heat susceptor 40 which is positioned directly below and serves as a support for crucible/capillary die unit 20. Although not shown, it is to be understood that a pedestal mounted in furnace enclosure 24 acts as a support for susceptor 40 and crucible/die unit 20. Susceptor 40 is made of graphite or other suitable material and is heated by suscepting electromagnetic energy generated by heating coil 26. Susceptor 40 transmits its heat to the crucible/die unit 20 so as to maintain the silicon in the crucible in a molten state.

The central hub 36 of the die/crucible unit 20 defines a center hole which is counterbored so as to form a shoulder 44. Susceptor 40 has a center hole 46 which is counterbored so as to form a shoulder 48. Susceptor 40 also has an annular projection or hub 50 on its upper side concentric with its center hole 46. Hub 50 extends into and makes a close fit with the center hole of hub 36, with shoulder 44 overlapping susceptor hub 50. One or more graphite locator pins 52 disposed in holes in the under side of the crucible/die unit and the upper side of the susceptor serve to properly orient those members relative to one another. In this connection, it is to be noted that in growing a hollow body of polygon cross-sectional configuration, the susceptor, like the die, is shaped to conform generally to that cross-sectional configuration.

The center hole 46 of the susceptor is filled with a multiple layers 53 of graphite felt insulation which surround a feed tube 54. The latter is connected to a melt replenishment system represented schematically at 56 that is adapted to deliver solid particles of silicon feed stock through into the region above the crucible, from which region the particles fall down into melt 38.

Mounted on the center hub of the crucible/die unit 20 is a standoff ring 60 made of quartz or graphite, and overlying hub 50 of the susceptor and the graphite felt insulation is an annular graphite plate or disk 62 that has an annular hub 64 at its inner edge. A silicon feed director member or umbrella 66 having a conically-shaped upper surface 68 is supported near its outer edge by ring 60. Feed director member 66 also is made of graphite and has a center hole that accommodates the top end of delivery tube 54 and a depending tubular extension 70 that sits on hub 64 of plate 62. Member 66 functions like an umbrella in that it intercepts falling silicon particles which then slide down its sloped upper surface 68 and spill into the crucible. Member 66 directs the falling particles into the melt 38 in the crucible.

The apparatus of FIG. 1 also includes a hat-shaped member 72 that encloses distributor member 66. Member 72 comprises a side wall 74, a top wall 76, and a peripheral flange 78 at the bottom edge of the side wall. Member 72 and flange 78 are made of graphite, and flange 78 sits on a plurality of standoff pins 80 that that are mounted in blind holes in bottom wall 34 of the crucible/die unit. The center of member 72 is provided with a replaceable graphite insert 82 that acts as a deflector of silicon particles delivered via feed tube 54.

Member 72 has three functions. It acts as a plenum to contain and distribute the gas used to transport silicon particles up feed tube 54. That gas passes between standoff pins 80 and also between flange 78 and the crucible/die unit 20 into the space inside of the growing hollow crystalline body 88. Member 72 also acts as an inner afterheater for the growing body 88. In this connection, it is to be noted that in growing a hollow body having a predetermined polygon cross-sectional configuration, member 72 (like the susceptor and die) is shaped in cross-section to conform generally to that predetermined cross-sectional configuration. A third function, produced primarily by deflector 82, is to deflect the silicon particles down onto feed director 66, whereby the particles can roll or fall down along conical surface 68 into the crucible to replenish the melt therein.

A second outer afterheater 90, like the one shown at 28 in FIG. 1 of said U.S. Pat. No. 5,037,622, surrounds the bottom end of the growing crystalline body 88, and cooperates with the inner afterheater 72 to provide control of the temperature of that body in the region just above the growth interface. The outer afterheater is made of graphite and is supported by a plurality of graphite standoff pins 92 that are mounted in blind holes in the upper end of the crucible outer side wall 32.

The apparatus of FIG. 1 additionally comprises a seed holder schematically illustrated at 94 for holding a seed (not shown) onto which the crystalline body 88 is grown. The seed usually takes the form of a short section of a previously grown crystalline body so as to facilitate startup of the growth process. Seed holder 94 is attached to a pulling mechanism 96 which is adapted to move seed holder 94 axially toward and away from capillary die/crucible unit 20. Seed holder 94 has a plurality of vent holes (not shown) to exhaust the gas from the plenum.

Growth of hollow bodies of silicon, e.g., octagons, using the apparatus of FIG. 1 is straightforward. With growth initiated and maintained in the manner described in said U.S. Pat. No. 5,037,622, silicon particles are injected from the melt replenishment system 56 through feed pipe 54 by a jet of inert gas. Necessarily the particles are injected at a substantial velocity in order to make certain that they enter the space between members 66 and 72. Typically the particles are injected by a gas stream having a velocity in the order of 1 meter/second. The particles discharged from pipe 54 are contained by graphite member 72 functioning as a plenum. The discharged silicon particles impinge upon deflector 82 which deflects them back down toward the conical upper surface 68 of umbrella-shaped feed director member 66. Most of the particles fall directly onto surface 68, and then slide down that surface and fall into the melt 38. Other particles may ricochet off of surface 68 into actual or near contact with top wall 76 of member 72 before falling into the melt. As a consequence, the particles falling into the crucible cause splashing of the melt 38, and some of the splashed liquid silicon may contact and solidify on the upper end of the crucible's center hub 36. Additionally some of the ricocheting particles may come into direct contact with the center hub and become attached thereto. As more silicon particles are fed into the crucible via feed tube 54, the solidified silicon on the upper end of hub 36 will tend to grow outward and form a mushroom-like solid piece as described above. The mushroom may even grow outwardly far enough to contact and become attached to the peripheral portion of umbrella-shaped member 66, in which event it cause severe non-uniformity in the circumferential temperature distribution at the growth interface and also may grow large enough to prevent any significant amount of silicon from falling into the crucible, resulting in premature termination of growth due to depletion of the supply of melt 38 in the crucible. It has been observed also that occasionally chunks of silicon may break from the mushroom and fall into the melt, causing the crucible to overfill and flood, a condition that usually results in termination of growth. Even without such premature termination of growth, the non-uniform temperature distribution at the growth interface leads to an undesirable large variation in the wall thickness, which in turn reduces the total yield of acceptable silicon wafers cut from the grown hollow body.

Figure 2:
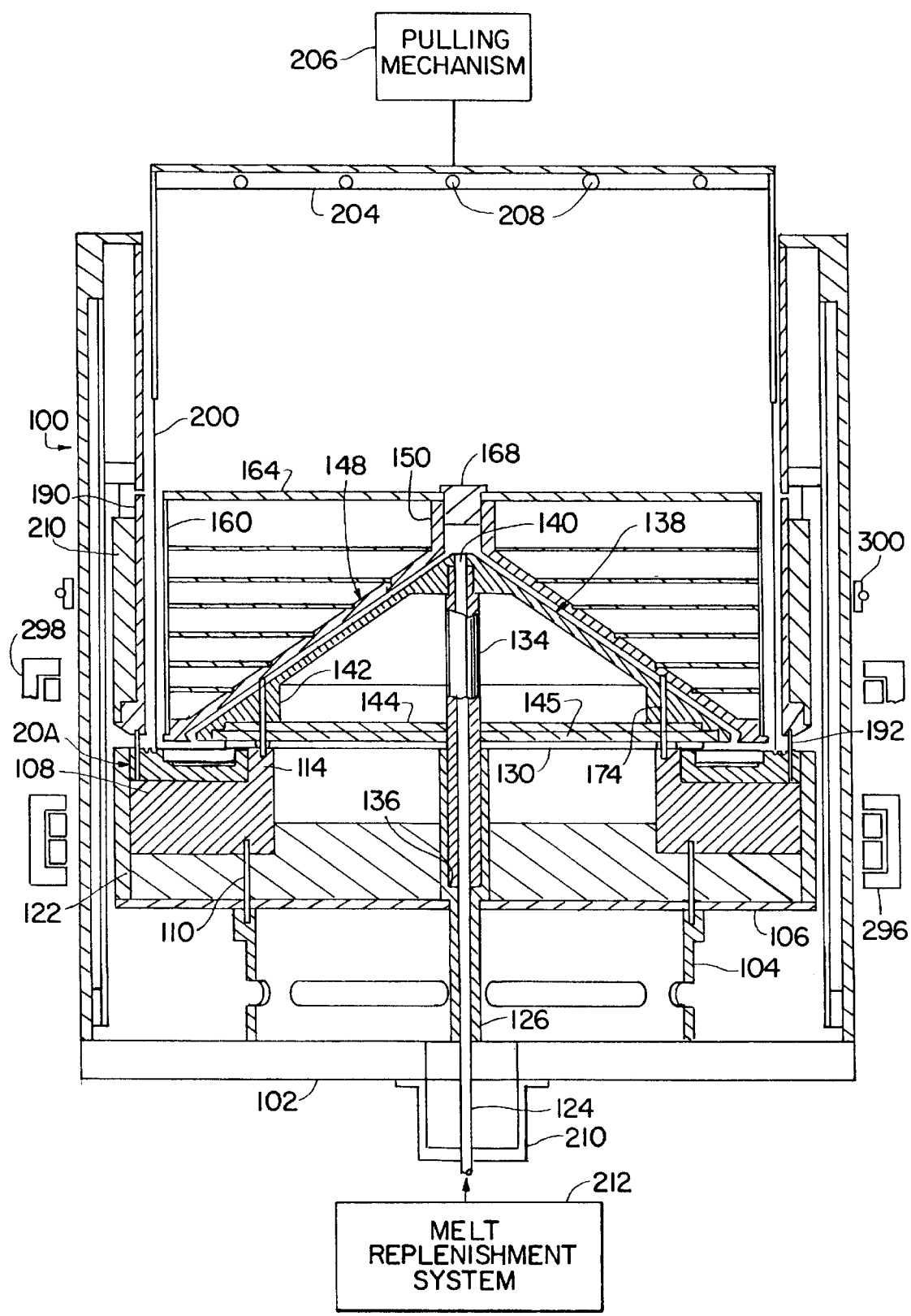
FIG. 2 is a view similar to FIG. 1 of a crystal growth furnace with an improved silicon feed distributor embodying the present invention.

FIG. 2 illustrates a furnace which comprises an improved form of particle distributor/inner afterheater structure embodying the present invention which is preferred for growing cylindrical hollow thin-wall silicon bodies having a diameter of approximately 20 inches. The apparatus shown in FIG. 2 comprises a quartz furnace enclosure 100 which is closed off at its bottom end by a base 102. A hollow pedestal 104 supported by base 102 carries a support plate 106. A graphite susceptor 108 is supported by the pedestal 104 by means of several graphite stand-off pins 110. The susceptor 108 is spaced from the support plate 106 and the intervening space is filled by multiple layers of graphite felt 112 which serves as a heat insulator (for convenience the several layers of graphite felt are represented as a single component in FIG. 2). Supported on the susceptor 108 is a crucible/die assembly 20A which, like the crucible unit 20 disclosed in FIG. 1, is made of graphite and in accordance with the teachings of U.S. Pat. No. 5,037,622, except that it is configured to grow a cylindrical rather than a polygonal body. The teachings of that patent are incorporated herein by reference thereto. The susceptor 108 has an upstanding flange or hub 114 that surrounds the inner surface of the crucible/die unit 20A. Additional graphite insulation 122 also surrounds the susceptor 108 and the crucible die assembly 20A.

The furnace base plate 102 has a center opening through which extends a graphite feed pipe 124. The feed pipe extends up through a lower support tube 126 made of graphite which protrudes through a hole in support plate 106. The upper end of support tube 126 carries a graphite radiation shield 130 which overlaps the inner portion of crucible/die unit 20A.

Mounted inside the support tube 126 and surrounding the feed tube 124 is an upper support tube 134. The upper end of lower support tube 126 has an enlarged inner diameter to accommodate the upper support tube 134. As seen in FIG. 1, the tube 134 rests on a shoulder 136 formed on the inner surface of tube 126. The upper end of tube 134 extends into and supports a conical particle feed director 138 (FIGS. 2 and 3A) made of graphite. The center of the conical member 138 has an axial bore 140 which is occupied by the upper end of feed pipe 124. The underside of conical member 138 is provided with a flange section 142 and is closed off by graphite plates 144, 145 which act collectively as a heat shield. The upper surface 139 of conical member 138 preferably extends at an angle in the range of 25 to 40 degrees from the horizontal, which is sufficient to assure that particles falling thereon will roll down to the bottom edge of the conical member. However, larger or smaller angles may also be employed. The bottom edge of the conical member 138, as seen best in FIG. 4, terminates in a cylindrical outer edge surface 146.

Overlying the conical member 138 is a conically-shaped graphite particle deflector member 148 having a cylindrical tubular hub 150 at its apex. As seen best in FIG. 3B, the underside or bottom surface 149 of the upper conical member 148 is flat and extends at the same angle as the upper surface 139 of the lower conical member 138. The upper surface 151 of conical member 148 is formed with a series of concentric circumferentially-extending grooves 152. The grooves 152 are L-shaped in cross-section, as seen best in FIG. 3B, and are sized to receive baffles in the form of flat annular graphite plates 154. In this case there are six plates 154A–154F with identical size outer diameters. The inner diameters of the plates are progressively larger from plate 154A to 154F, with the inner edges 155 of the plates nesting in grooves 152 of the upper conical member 148.

Figure 3A:
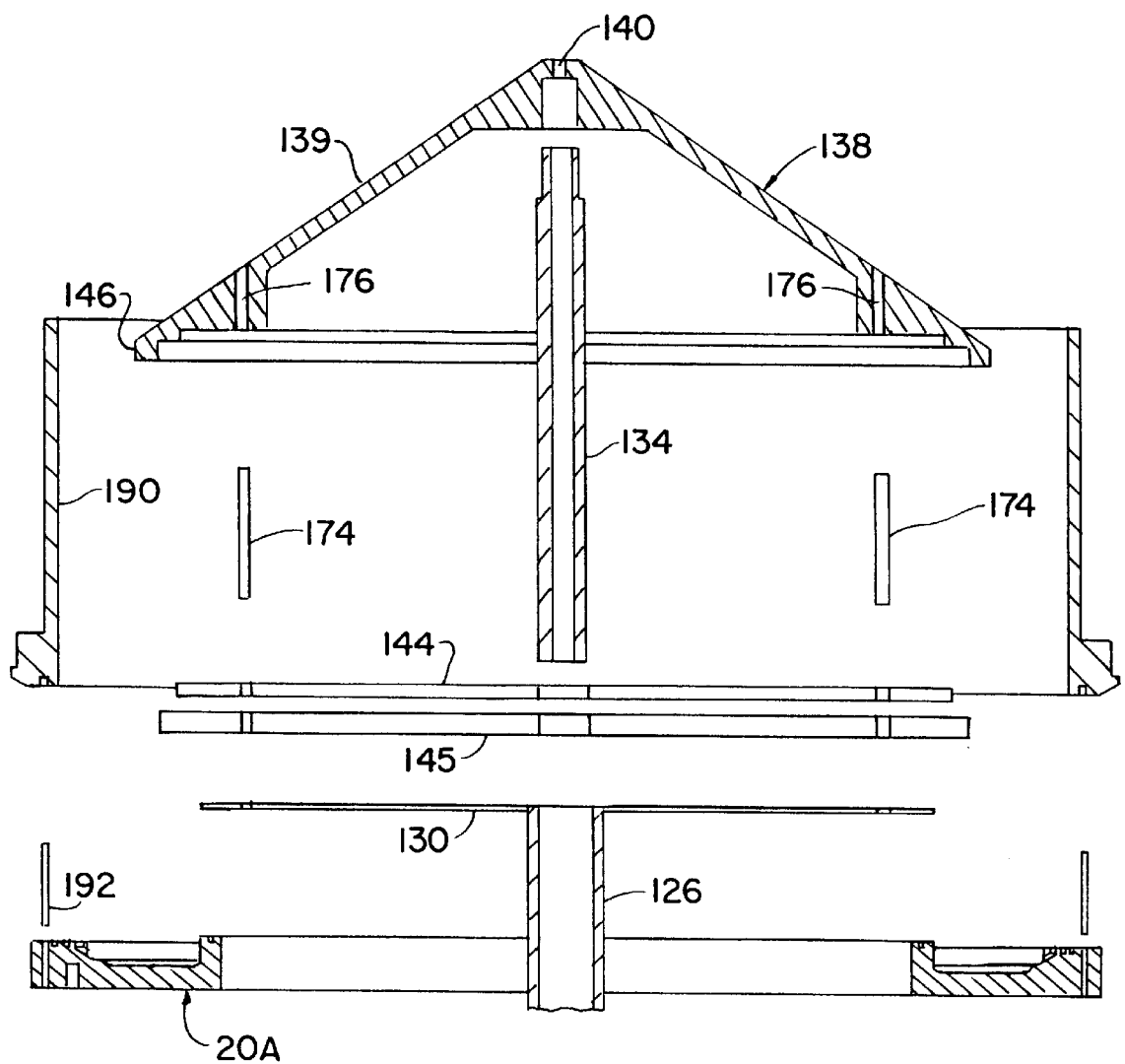
FIG. 3A is an enlarged exploded view of the lower portion of the improved feed distributor in relation to an EFG crucible/die assembly.
Figure 3B:
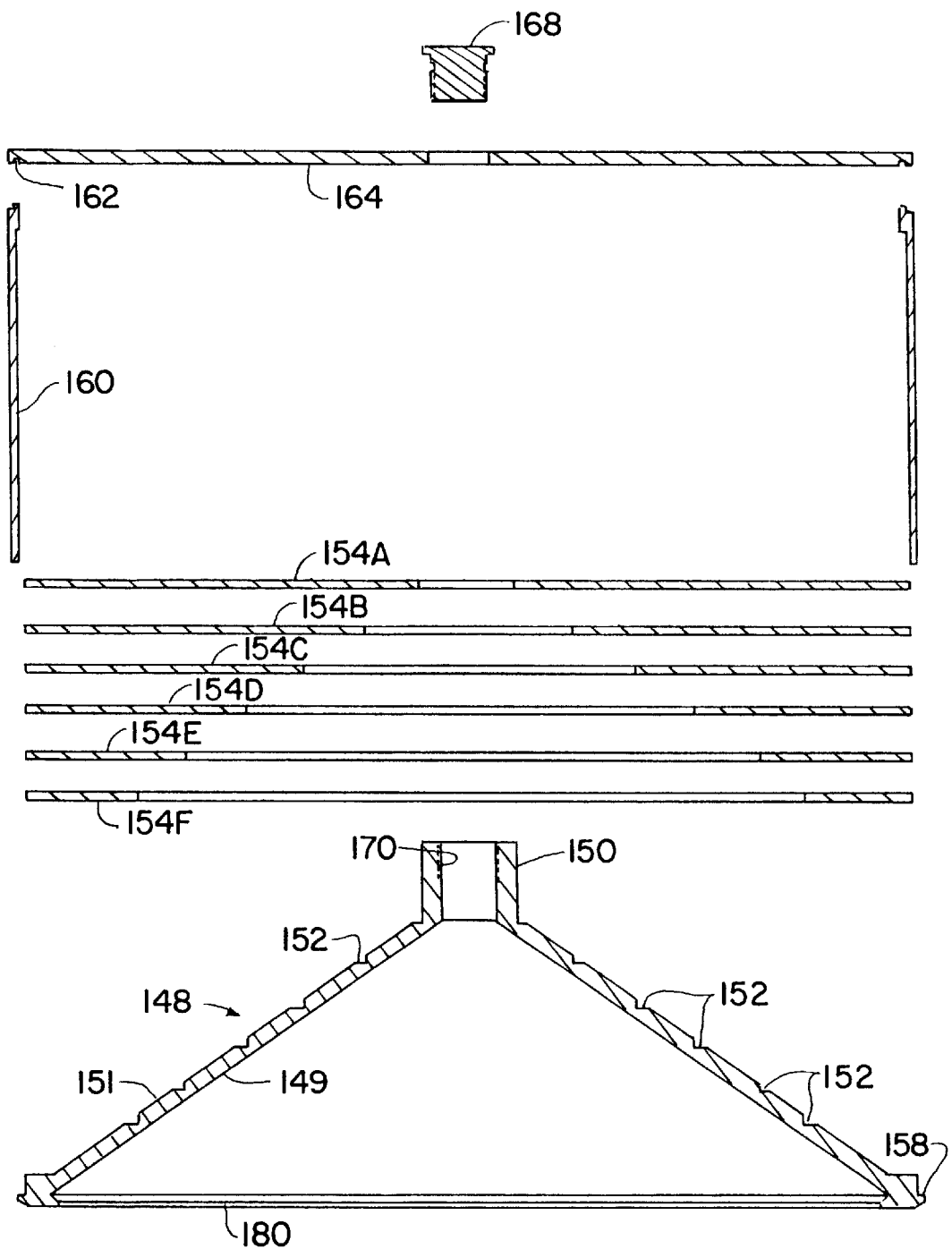
FIG. 3B is an enlarged exploded view of the upper portion of the improved feed distributor.

Still referring to FIGS. 2 and 3B, conical member 148 has a peripheral rib 158 which acts as a shoulder to support a cylindrical inner afterheater member 160 made of graphite. The latter surrounds and is close to the outer edges of the plates 154A–154F, and its upper end edge is seated in a groove 162 in a top plate 164. The latter has a center hole 166 that is sized to accommodate a threaded graphite plug 168. The latter is screwed into the hub 150 of conical member 148, the latter being internally threaded as shown at 170 in FIG. 3B. The engagement of plug 168 with hub 150 serves to keep cylinder 160 tied to conical member 148 so as to form a unitary structure.

Referring again to FIGS. 2 and 3A, the particle deflector member 148 is supported by a plurality of graphite standoff pins 174 which extend through holes 176 in conical member 138 and other aligned holes in plates 144, 145 and shield 130 and are received in blind holes in hub 114 of susceptor 108. The standoff pins 174 are spaced circumferentially around the hub portion 114 of susceptor 108 and have a length such as to provide a narrow gap between the under surface 149 of the upper conical member 148 and the parallel upper surface 139 of the lower conical member 138. Preferably, but not necessarily, that gap is in the range of 0.12 to 0.20 inch.

Figure 4:
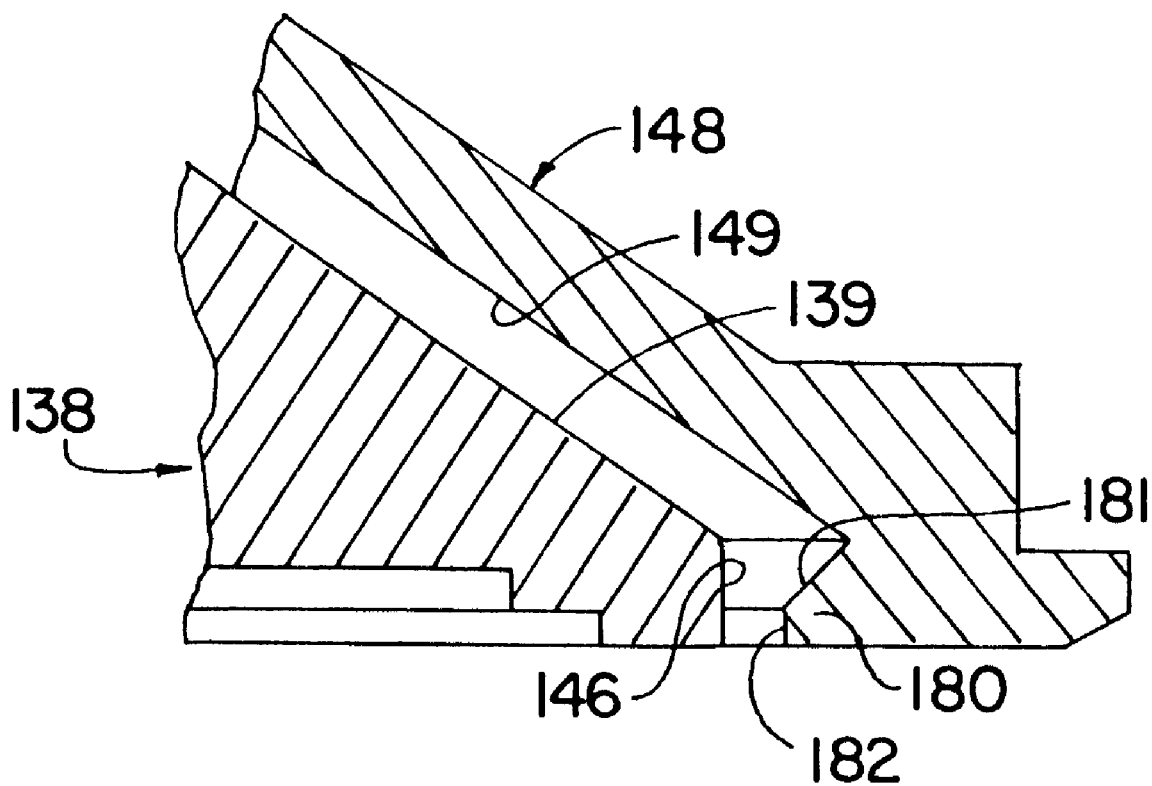
FIG. 4 is an enlarged sectional view of the discharge orifice section of the improved feed distributor.

Referring now to FIGS. 3B and 4, the upper conical member 148 is formed with a reverse or inturned lip 180 at the bottom end. Preferably the lip 180 has an inclined (conical) upper surface 181 joined to a cylindrical inner edge surface 182, whereby the gap between the surfaces 139 and 149 is increased at its bottom end in the region of inclined surface 181 and then is decreased in the region of the inner edge surface 182 of the upper cone member 148.

The illustrated apparatus also includes a graphite outer afterheater 190 (FIGS. 2 and 3A) which surrounds and is spaced from the inner afterheater cylinder 160. The afterheater 190 is supported by a plurality of graphite standoff pins 192 which extend through holes in the crucible die assembly and are supported by the susceptor 108. The outer afterheater 190 and the afterheater member 160 define an annular axially-extending channel through which a crystalline tubular body 200 may be grown and pulled away from the crucible die unit 20A. Preferably, the outer afterheater is surrounded by an insulating medium 210 in the form of graphite felt. The illustrated apparatus also includes a graphite seed holder 204 which is attached to a pulling mechanism 206. The seed holder 204 holds a seed on which the crystalline body 200 is grown. According to customary practice, the seed is typically a section of a previously grown tubular body of like cross-sectional configuration. The seed holder is provided with vent holes 208 to vent gas from inside the growing crystalline body and thereby avoid pressure buildup that may adversely affect the growth process.

The feed tube 124 extends through a cap 210 affixed to the base 102 and is coupled to a melt replenishment system 212 which is adapted to inject silicon particles on command so as to maintain the level of the melt in the crucible within predetermined limits. Suitable melt replenishment systems are described in U.S. Pat. No. 4,968,380 issued to G. M. Freedman et al.; U.S. Pat. No. 5,085,728 issued to B. H. Mackintosh et al.; and U.S. Pat. No. 5,098,229 issued to F. U. Meier et al.

In the foregoing structure, the plates 154A–F and cover plate 164 act to promote an approximately constant temperature gradient along the length of inner afterheater 160, parallel to the pulling axis. Also, the two conical members 138 and 148 function as a distributor for silicon particles which are introduced from the melt replenishment system via the feed tube 124. Conical member 148 serves as a particle deflector and conical member 138 acts as a particle director, with the two of them cooperating to channel the flow of silicon particles into the crucible. The particles are injected via feed tube 124 at a substantial velocity. The particles impinge on the plug 168 and are deflected downwardly into the conical gap between the surfaces 139 and 149. The particles fall down along the gap and impinge on the inclined surface 181 of rib 180. The particles tend to ricochet off of inclined surface 181, with some striking the outer edge surface 146 of the inner cone 138, and others tending to fall immediately through the gap between surface 146 and surface 182. Essentially, the inclined surface 181 interrupts the fall of the particles, so that they thereafter fall into the crucible at a reduced velocity. Referring again to FIG. 2, the conical members 138 and 148 are sized so that the discharge orifice formed by the surfaces of lip 180 and the adjacent surface 146 of the bottom cone 138 is substantially centered between the inner and outer diameters of the portion of the crucible containing the melt. This assures that the particles falling into the melt cannot impinge on the hub portion of the crucible. Additionally, the reduction in velocity of the particles produced by engagement with the lip 180 assures that the particles will cause little or no splashing of the melt. As a consequence of the foregoing construction, the mushroom problem is eliminated or substantially reduced.

It should be observed that the velocity at which the particles drop into the melt is a function of the angle of the surfaces 139 and 149, and that having those surfaces extend at a shallower angle will help reduce the velocity at which the particles drop into the crucible. Accordingly, it is contemplated that the lip 180 may be omitted, as in the alternative embodiment described below.

Figure 5A:
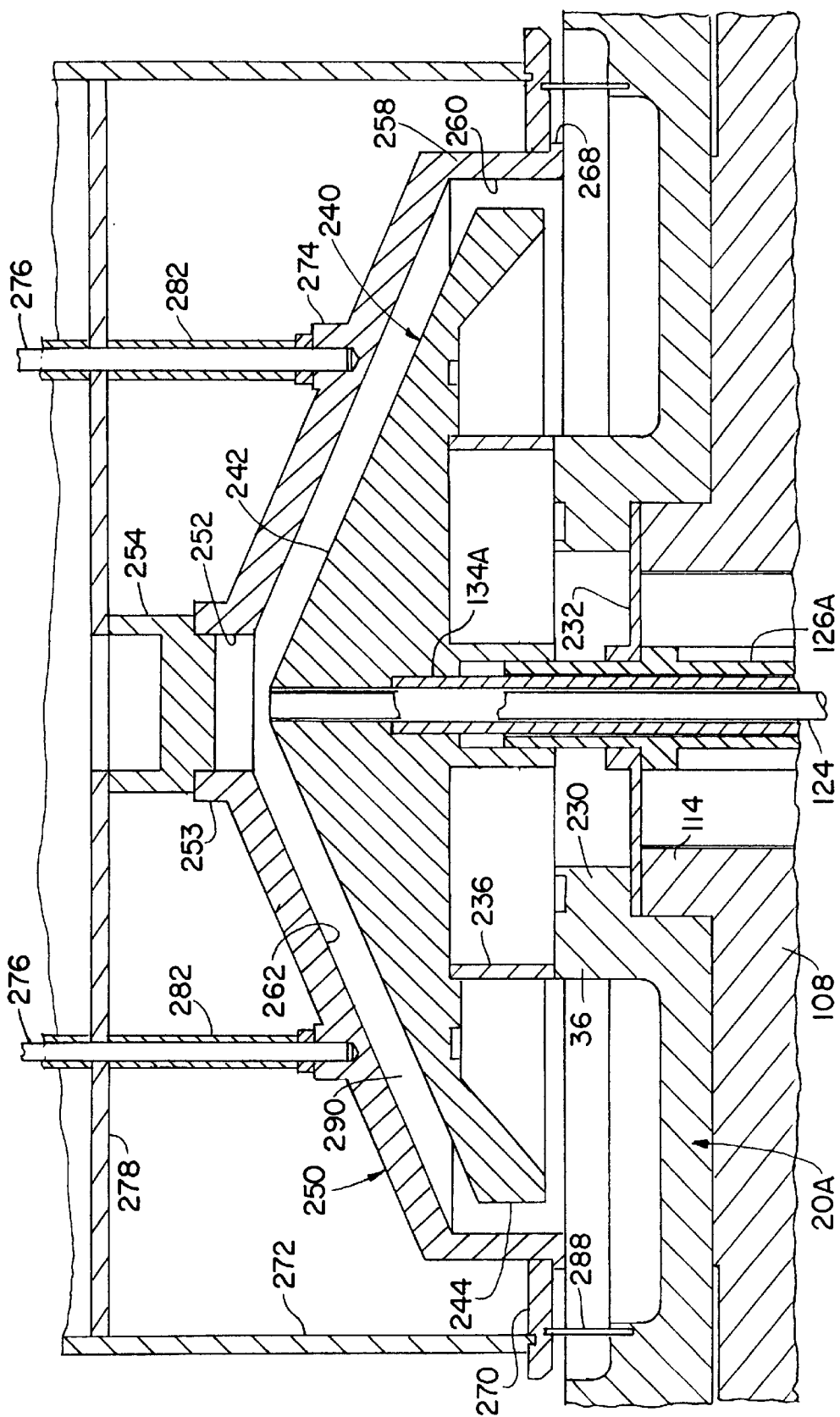
FIGS. 5A and 5B are an enlarged fragmentary sectional views illustrating an alternative embodiment of the invention.
Figure 5B:
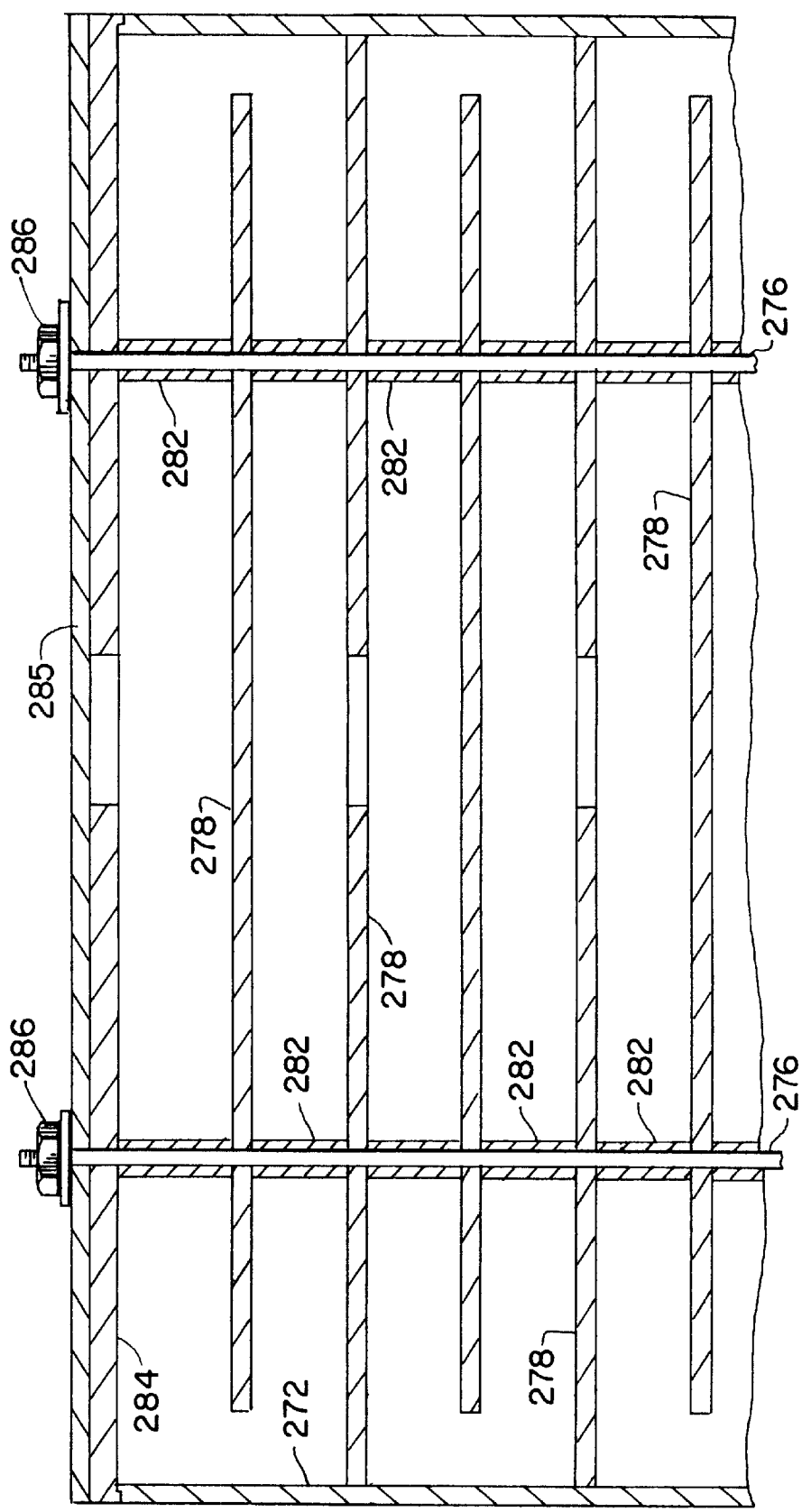

FIGS. 5A and 5B illustrate a modification of the invention which is preferred for growing hollow bodies of polygonal cross-sectional shape, e.g., "octagons". FIG. 5A shows the lower portion and FIG. 5B shows the upper portion of a common structure. In this connection it should be noted that FIGS. 5A and 5B constitute a fragmentary illustration, with the furnace enclosure, outer afterheater and outer portion of the crucible and susceptor being omitted. However, it is to be understood that the embodiment of FIG. 5 is used in conjunction with a furnace as shown in FIG. 2.

The apparatus shown in FIGS. 5A and 5B comprises susceptor 108 supporting the crucible/die assembly 20A. The capillary die portion of crucible/die unit 20A, and preferably also the outer wall of the crucible portion of the same unit, and also the outer afterheater (not shown) are shaped so as to conform in plan view to the polygonal cross-sectional configuration of the hollow body which is to be grown. In this case the center hub 36 of the crucible has an interior lip or flange 230 which overlies susceptor hub 114 and is spaced therefrom by a graphite spacer member 232 which is mounted on and surrounds a lower support tube 126A. The latter surrounds and supports an upper support tube 134A which serves as a guide for feed tube 124. Seated on crucible hub 36 is a graphite standoff ring 236. Seated on the standoff ring is a tapered particle director member 240 made of graphite that acts as an umbrella and is the functional equivalent of member 138. The upper surface 242 of member 240 is essentially flat and is inclined at a selected angle to the horizontal so as to provide a conical profile in cross-section. In the instant case, surface 242 is shown as extending at a shallower angle than the surface 139 of the corresponding conical member 138 of FIG. 2. At its periphery, surface 242 is joined to an outer edge surface 244. The latter is cylindrical and upper surface 242 is conical. Director member 240 has a center hole which is counterbored to receive the upper end of upper support tube 134A. The upper end of feed tube 124 extends through tube 134A to the apex of member 242.

The apparatus of FIGS. 5A and 5B also includes a tapered particle deflector member 250 which is the functional equivalent of member 148 of FIG. 2. Particle deflector member 250 has a central threaded opening 252 with a top flange 253. A plug 254 is set into opening 252. Member 250 also has a depending side edge wall 258. The latter has a round configuration in plan view and its inner surface 260 extends parallel to the axis of feed tube 124. The inner (bottom side) conical surface 262 of the upper conical member 250 is flat and extends at substantially the same angle as the upper surface 242 of the lower conical member 240. The side wall 258 has a peripheral flange 268 at its bottom end which serves as a support for an annular plate 270. The plate 270 supports a graphite inner afterheater 272 that has the same polygonal cross-sectional shape as side wall 258. Although not shown, it is preferred that inner afterheater 272 consist of a plurality of flat graphite plates, one for each side of the polygonal body to be grown, with the plates sitting in grooves in plate 270 as shown.

Deflector member 250 is formed with a continuous circular boss 274 that has threaded holes for receiving threaded tie rods 276 that are used to connect a plurality of flat graphite plates 278 that serve to assure a thermal gradient parallel to the axis of afterheater 272. Spacer tubes 282 on the tie rods serve to keep a selected spacing between plates 278. The top plate 284 is grooved to interlock with the upper ends of the plates that make up outer afterheater 272. Nuts 286 on the upper end of tie rods 276 act to press a support plate 285 against top plate 284, thereby causing plate 278, afterheater 272 and plate 270 to be locked to member 250, so as to form a unitary structure. That structure is supported by a plurality of standoff pins 288 which are received in blind holes in plate 270 and the crucible/die unit 20A. The pins 288 have a length such as to maintain plate 270 in close proximity to the crucible/die unit as shown, with the spacing between surfaces 242 and 262 being large enough to assure free flow of particles down along surface 242 but small enough to control the trajectory of the particles as they are deflected by plug 254.

In this arrangement, particles introduced via the feed tube 124 impinge upon the deflector plug 254. The particles are then deflected by the plug 254 so as to fall into the gap 290 formed between the two members 240 and 250. The particles travel downwardly along the gap 290 into the annular space between the surfaces 244 and 260. As the particles travel down along the gap 290, they tend to strike the surface 260 at different points spaced vertically along the height of the surface 260. Some of the particles ricochet off of the surface 260 against the surface 244, while others fall from the surface 260 directly into the melt. The discharge orifice formed between surfaces 244 and 260 is located so as to discharge particles at a point which is intermediate the die portion of the crucible and the crucible hub 36. As a consequence, the silicon particles dropping into the melt do not come into contact with the hub 36. Also, because their velocity is impeded as a result of impinging on the surfaces 260 and 244, the particles tend to drop into the melt without creating any substantial disturbance or splashing, thereby avoiding accretions of liquid silicon on the higher portions of the hub 36 which tend to be cooler.

Referring again to FIG. 2, another aspect of the invention relates to the induction heating means associated with the crystal growth apparatus. FIG. 2 schematically illustrates two heating coils 296 and 298 surrounding the furnace enclosure, with coil 296 having two turns and coil 298 having a single turn. However, the number of turns characterizing each coil may be varied. Mechanical means (not shown) support coils 296 and 298 in concentric relation with the furnace enclosure. Preferably the coil 296 is disposed at the level of the susceptor 108 so as to impart most of its energy to that component, which in turn provides heat to the crucible. The coil 298 is preferably disposed so that it surrounds the bottom end the outer afterheater 190, whereby to impart heat to both afterheaters. Disposed above coil 298 in surrounding relation to the furnace enclosure is a Faraday ring 300. Mechanical means (not shown) support the Faraday ring so that it can be moved vertically toward or away from coil 298. Although not shown, the coils 296 and 298 are connected in series with a suitable electrical power supply, whereby they may be energized to inductively heat the elements that they surround. The Faraday ring, also known as a "shorted turn" or "shorted ring", interacts with the magnetic field of the secondary heating coil 298, resulting in that ring providing a magnetic field that distorts and opposes the magnetic field created by energizing coil 298. Moving ring 300 closer to coil 298 increases that opposing magnetic field. Changing the magnetic field of coil 298 affects the ratio of the current flowing in that coil to the current flowing in coil 296. The net effect resulting from the opposing magnetic field is that it reduces the effective heat output of coil 298, thereby modifying the ratio of its heat input to that of coil 296. In practice, the Faraday ring position is adjusted until the operator is satisfied that the thermal input to the crucible and the outer afterheater is such as to optimize the growth process.

The apparatus improvements described above offer the advantage of eliminating or substantially reducing the "mushroom" problem and also providing an impressive method of controlling the heating effect of two adjacent heating coils. A further advantage is that installing the improved particle distributor/inner afterheater structure in crystal growth apparatus as shown in FIG. 1 does not require any substantial changes to that apparatus or to the method of growing hollow bodies. In this connection it should be noted that the present invention retains all of the advantages of the invention disclosed and claimed in said U.S. Pat. No. 5,037,622 while providing better particle delivery to the crucible.

Certain changes and modifications may be made in the above device without departing from the scope of the invention herein involved. Thus, for example, the top end surface of the capillary crucible/die unit may be designed to produce hollow bodies with circular, elliptical, triangular, rectangular, or other cross-sectional configurations. Also, the relative dimensions of different portions of the structure shown in the drawings may be varied. For example, the angles of the confronting surfaces of the deflector and director members may be varied to adjust the velocity at which particles are discharged into the melt and in accordance with changes in the dimension of the crucible/die unit as required to grow different size hollow bodies.

Other changes in the design of the crucible/die assembly also may be made without departing from the principles of the present invention. Thus, for example, the crucible and EFG die may be formed as two separate and distinct members that are assembled to one another so as to form the functional equivalent of the integral crucible/die unit 20A shown in the drawings. Also the particle distributor/inner afterheater structure of FIGS. 5A and 5B may be modified for use in growing large cylindrical bodies, and the corresponding structure of FIGS. 2–4 may be modified for use in growing octagons or other bodies with a polygonal or other cross-sectional configuration. In this connection, it is to be appreciated that the surface 244 of director member 240 and depending wall 258 of deflector member 250 could be shaped so as to be polygonal in plan view, e.g., octagonal, in the case of growing hollow bodies of octagonal cross-section. Although the invention is directed to an improved apparatus and method for growing tubular bodies of silicon, persons skilled in the art will appreciate that the invention may be used to grow shaped bodies of other crystalline materials, as described in other issued patents pertaining to EFG methods and apparatus. In growing bodies of a material other than silicon, the several components of the EFG growth zone, e.g., the crucible/die unit, afterheaters, radiation shields, etc. may need to be made of a material other than graphite in order to obtain bodies having suitable composition, purity and strength.

Still other possible modifications will be obvious to persons skilled in the art. Therefore, it is intended that all matter contained in the above description or shown in the accompanying drawings shall be interpreted in an illustrative and not in a limiting sense.

What is claimed is:

1. Apparatus for growing a tubular crystalline body of a selected material by the EFG process, the apparatus comprising:
    a crucible/die unit comprising a crucible having a bottom wall, an outer side wall, and an inner side wall defining a center opening, said bottom wall and said side walls together defining an interior annular space for containing a liquid supply of said selected material, and a capillary die for use in growing shaped bodies from said liquid supply;
    a susceptor supporting said crucible, said susceptor also having a center hole that is aligned with said center opening;
    a feed distributor/inner afterheater assembly disposed above said crucible, and comprising a feed director, a feed deflector and a tubular inner afterheater;
    said feed director comprising a director member having a center aperture and an inclined upper surface surrounding said center aperture, said director member being mounted above and spaced from said crucible and being oriented so that said inclined upper surface decreases in radius with increasing distance from said crucible;
    said feed deflector being mounted above said feed director and comprising a deflector member having an inclined lower surface that is coaxial with and confronts said inclined upper surface of said director member, said inclined lower surface being in close spaced relation with said inclined upper surface so as to define an inclined annular gap therebetween, and deflector means at the center of said inclined lower surface in position to intercept feed particles introduced through the center aperture of said director member and deflecting them into said gap;
    said tubular inner afterheater being above said crucible in coaxial relation with said capillary die and in surrounding relation with said feed director and said feed deflector; and
    a feed tube extending through said center opening of said crucible, said center hole of said susceptor and said center aperture of said director member for receiving feed particles from a particle feeder and discharging said particles at said deflector means, whereby said feed particles will impinge upon and be deflected by said deflector means into said gap;
    said director member and said deflector member defining an annular discharge orifice for said gap above said crucible, said discharge orifice being located close to the level of the upper end of said crucible and intermediate the inner and outer side walls of said crucible.

2. Apparatus according to claim 1 wherein said feed deflector is supported by said feed director.

3. Apparatus according to claim 1 wherein said feed deflector is supported by said crucible.

4. Apparatus according to claim 1 wherein said inner afterheater is joined to and supported by said feed deflector.

5. Apparatus according to claim 1 wherein said deflector member has an inclined upper surface, and further including a plurality of mutually spaced baffles supported by said inclined upper surface of said deflector member.

6. Apparatus according to claim 5 wherein said baffles are plates with each of said plates having an inner edge that defines a center opening, and further wherein the said inner edges of said plates are seated in grooves in said inclined upper surface of said deflector member.

7. Apparatus according to claim 5 wherein said tubular inner afterheater surrounds said baffles.

8. Apparatus according to claim 5 wherein said feed deflector member has a tubular hub coaxial with said center hole, and further including an end plate with a center hole that overlies and is engaged with said tubular hub of said feed deflector member and the upper end of said inner afterheater and said deflecting means is a plug that is secured in said tubular hub of said feed deflector member and acts to secure said end plate to said tubular hub.

9. Apparatus according to claim 1 further including a plurality of mutually spaced baffles mounted above said deflector member and surrounded by said inner afterheater.

10. Apparatus according to claim 1 wherein said deflector member has a peripheral flange, and said inner afterheater is seated on and supported by said flange.

11. Apparatus according to claim 1 wherein said deflector member has a center hole, and said deflecting means comprises a plug member mounted in said center hole of said deflector member.

12. Apparatus according to claim 1 wherein said upper inclined surface of said director member has a bottom end, and said director member has a circumferentially-extending outer edge surface that is joined to said bottom end of its said upper inclined surface, said outer edge surface also extending substantially parallel to the longitudinal axis of said director member, and further wherein said lower inclined surface of said deflector member has a bottom end, and said deflector member has a circumferentially-extending inner edge surface that is joined to said bottom end of said lower inclined surface, said inner edge surface confronting said outer edge surface of said director member and cooperating therewith to define an annular discharge orifice for said inclined gap, said gap being aligned with a region of said crucible that is intermediate said outer and inner side walls of said crucible.

13. Apparatus according to claim 12 wherein said inner edge surface extends parallel to said outer edge surface.

14. Apparatus according to claim 12 wherein said inner edge surface extends at an inclined angle to said outer edge surface, so that the radial dimension of said discharge orifice decreases with increasing distance from said conical surfaces.

15. Apparatus according to claim 1 further including a support pipe engaged with and supporting said feed director member.

16. Apparatus according to claim 15 wherein said feed pipe extends through said support pipe.

17. Apparatus according to claim 1 wherein said discharge orifice has an inner end and an outer end, and further wherein the spacing between said director member and said deflector member is greater at said inner end than at said outer end of said discharge orifice.

18. Apparatus according to claim 17 wherein said inclined lower surface of said deflector member has a bottom end that is terminated by an inturned rib, with said discharge orifice being defined in part by said inturned rib.

19. Apparatus for growing a tubular crystalline body of a selected material by the EFG process, the apparatus comprising:
a furnace enclosure;
a heat susceptor positioned within said enclosure, said susceptor having a hole therethrough;
a crucible/capillary die assembly supported by said heat susceptor within said enclosure, said assembly having a bottom wall, an outer side wall, and an inner side wall defining a central opening that is aligned with said susceptor hole and a crucible surrounding said opening for containing a liquid supply of said selected material, and a capillary die having a tip for supporting a liquid/solid growth interface supplied from a melt contained in the crucible and for controlling the cross-sectional configuration of the grown crystalline body;
a feed tube extending upwardly through said susceptor hole and said central opening for use in injecting a gas stream carrying solid particles of said selected material into the space above said crucible/die assembly;
a particle deflector positioned above the upper end of said feed tube in position to intercept solid particles of said selected material and deflect them downwardly toward said crucible; and
a particle director supported in surrounding relation to the upper end of said feed tube, said particle director being disposed below said particle deflector and being shaped and positioned so as to intercept solid particles of said selected material that are deflected downwardly by said deflector member and direct them into the crucible, whereby to replenish a melt of said selected material in said crucible;
said particle deflector and particle director having confronting and mutually spaced conical surfaces that define an annular gap therebetween, with said gap having an upper end in position to receive particles that are deflected by said deflector member and a bottom end in position to discharge said particles into said crucible in a region intermediate said outer and inner side walls of said crucible.

20. Apparatus according to claim 19 wherein said particle deflector comprises a conical member characterized by one of said conical surfaces, and further including a tubular inner afterheater member supported by said conical member.

21. Apparatus according to claim 20 wherein said inner afterheater member is engaged with a peripheral portion of said conical member.

22. Apparatus according to claim 20 further including a plurality of baffles in the form of parallel mutually spaced heat conducting plates that extend transversely to and are surrounded by said afterheater member.

23. Apparatus according to claim 20 wherein said plates are locked to said conical member by tie rods.

24. Apparatus according to claim 19 wherein said particle director is supported by said feed tube.

25. Apparatus according to claim 24 wherein said particle deflector is supported by standoff pins that are mounted to said susceptor and pass through openings in said particle director.

26. An apparatus for growing a tubular crystalline body of a selected material by the EFG process comprising:
a furnace enclosure;
a crucible/capillary die unit within said enclosure and comprising a crucible for containing a melt of said selected material, said crucible being annular so as to define a center opening, and an EFG capillary die communicating with the interior of said crucible for supporting a film of said selected material from which said hollow tubular body is grown and for determining the cross-sectional configuration of said crystalline body;
growing means comprising (1) a seed holder for supporting a seed onto which said crystalline body is grown and (2) pulling means for pulling said tubular crystalline body and said seed holder away from said crucible;
a heat susceptor supporting said crucible within said enclosure; and
electrical heating means, said electrical heating means comprising primary and secondary induction heating coils, with said primary coil surrounding said enclosure in position to inductively heat said susceptor and said secondary coil being located above said primary coil in position to provide inductive heating of the growing tubular body, and a Faraday ring surrounding said furnace enclosure in proximity to said secondary heating coil, said Faraday ring being movable lengthwise of said furnace enclosure toward or away from said secondary coil whereby to distort the magnetic field of said secondary coil and thereby alter the ratio of currents flowing through primary and secondary coils.

27. Apparatus according to claim 26 wherein said secondary heating coil is a single turn coil.

28. Apparatus according to claim 26 further including outer and inner afterheaters disposed within said enclosure with a gap between said afterheaters through which said tubular crystalline body is pulled, and further wherein said secondary coil is positioned so as to surround and provide induction heating of said outer afterheater.

29. An apparatus for growing a tubular crystalline body of a selected material by the EFG process comprising:
a crucible for containing a melt of said selected material, said crucible being annular so as to define a center opening;
growing means for growing a tubular crystalline body of said selected material from said melt, said growing means comprising (1) a capillary die communicating with the interior of said crucible for determining the cross-sectional configuration of the tubular body to be grown, (2) a seed holder for supporting a seed onto which said crystalline body is grown and (3) pulling means for pulling said tubular crystalline body and said seed holder away from said die;

a heat susceptor supporting said crucible, said susceptor having a hole therethrough in alignment with said center opening;

electrical means for heating said susceptor;

a feed tube for injecting solid particles of said selected material into a space above said crucible, said tube extending through said hole and said center opening with the upper end of said tube terminating above said crucible;

a deflector positioned above said upper end of said tube in position to intercept said particles and deflect them downwardly toward said crucible;

a director surrounding said feed tube below said deflector in position to intercept particles of said selected material falling away from said deflector;

said deflector and distributor comprising mutually confronting and substantially parallel conical surfaces that decrease in radius with increasing distance from said crucible and together define an inclined channel, and additional mutually confronting surfaces joined to said conical surfaces at the peripheries of said conical surfaces so as to define an annular discharge orifice for directing particles from said channel into said crucible.

* * * * *